(12) United States Patent
Lanzerotti et al.

(10) Patent No.: US 7,138,669 B2
(45) Date of Patent: Nov. 21, 2006

(54) SILICON GERMANIUM HETEROJUNCTION BIPOLAR TRANSISTOR WITH CARBON INCORPORATION

(75) Inventors: Louis D. Lanzerotti, Burlington, VT (US); Brian P. Ronan, North Merrick, NY (US); Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 75 days.

(21) Appl. No.: 10/660,048

(22) Filed: Sep. 11, 2003

(65) Prior Publication Data
US 2005/0051798 A1    Mar. 10, 2005

Related U.S. Application Data

(62) Division of application No. 09/683,498, filed on Jan. 9, 2002, now Pat. No. 6,670,654.

(51) Int. Cl.
*H01L 29/739* (2006.01)
*H01L 27/02* (2006.01)
(52) U.S. Cl. ...................... 257/197; 257/565
(58) Field of Classification Search ............... 257/197, 257/198, 187, 191, 565
See application file for complete search history.

(56) References Cited

U.S. PATENT DOCUMENTS

| | | | |
|---|---|---|---|
| 4,885,614 A | 12/1989 | Furukawa et al. | |
| 5,116,455 A | 5/1992 | Daly | |
| 5,141,894 A * | 8/1992 | Bisaro et al. | 438/479 |
| 5,321,302 A | 6/1994 | Shimawaki | |
| 5,338,945 A | 8/1994 | Baliga et al. | |
| 5,360,986 A | 11/1994 | Candelaria | |
| 5,387,807 A | 2/1995 | Bayraktaroglu | |
| 5,404,028 A | 4/1995 | Metzger et al. | |
| 5,468,658 A | 11/1995 | Bayraktaroglu | |
| 5,557,118 A | 9/1996 | Hashimoto | |
| 5,731,626 A | 3/1998 | Eaglesham et al. | |
| 5,734,183 A | 3/1998 | Morishita | |
| 5,750,443 A * | 5/1998 | Sakamoto | 438/795 |
| 5,783,845 A | 7/1998 | Kondo et al. | |

(Continued)

FOREIGN PATENT DOCUMENTS

DE    WO 98/26457    6/1998

(Continued)

OTHER PUBLICATIONS

Lanzerotti et al., "Suppression of Boron Outdiffusion in SiGe HBTs by Carbon Incorporation", 1996 IEEE, pp. 10.2.1-10.2.4.

(Continued)

*Primary Examiner*—T. N. Quach
(74) *Attorney, Agent, or Firm*—Gibb I.P. Law Firm, LLC; Anthony Canale (57) ABSTRACT

A silicon germanium heterojunction bipolar transistor device and method comprises a semiconductor region, and a diffusion region in the semiconductor region, wherein the diffusion region is boron-doped, wherein the semiconductor region comprises a carbon dopant therein to minimize boron diffusion, and wherein a combination of an amount of the dopant, an amount of the boron, and a size of the semiconductor region are such that the diffusion region has a sheet resistance of less than approximately 4 Kohms/cm$^2$. Also, the diffusion region is boron-doped at a concentration of $1\times10^{20}$/cm$^3$ to $1\times10^{21}$/cm$^3$. Additionally, the semiconductor region comprises 5–25% germanium and 0–3% carbon. By adding carbon to the semiconductor region, the device achieves an electrostatic discharge robustness, which further causes a tighter distribution of a power-to-failure of the device, and increases a critical thickness and reduces the thermal strain of the semiconductor region.

15 Claims, 6 Drawing Sheets

U.S. PATENT DOCUMENTS

| | | |
|---|---|---|
| 5,814,843 A | 9/1998 | Ohkubo |
| 5,986,287 A | 11/1999 | Eberl et al. |
| 6,043,139 A | 3/2000 | Eaglesham et al. |
| 6,096,617 A | 8/2000 | Kizuki |
| 6,107,151 A | 8/2000 | Enquist |
| 6,229,197 B1 | 5/2001 | Plumton et al. |
| 6,246,104 B1 | 6/2001 | Tsuda et al. |
| 6,410,975 B1 * | 6/2002 | Racanelli .................... 257/591 |
| 6,509,242 B1 | 1/2003 | Frei et al. |
| 6,534,371 B1 | 3/2003 | Coolbaugh et al. |
| 6,670,654 B1 * | 12/2003 | Lanzerotti et al. .......... 257/197 |
| 6,750,484 B1 * | 6/2004 | Lippert et al. .............. 257/198 |
| 2002/0192918 A1 | 12/2002 | Takagi et al. |
| 2003/0006484 A1 | 1/2003 | Asai et al. |
| 2003/0094673 A1 | 5/2003 | Dunn et al. |
| 2004/0251473 A1 | 12/2004 | Asai et al. |

FOREIGN PATENT DOCUMENTS

| | | |
|---|---|---|
| EP | 0717435 A1 * | 6/1996 |
| JP | 11312685 A | 11/1999 |
| JP | 2000012558 A | 1/2000 |
| JP | 92000174033 A | 6/2000 |

OTHER PUBLICATIONS

Stock et al. "Carbon Incorporation in Silicon for Suppressing Interstitial-Enhanced Boron Diffusion", Applied Physics Letter, Mar. 13, 1995, vol. 66, Issue 11, pp. 1370-1372.

Ghanti et al., "Control of Implant-Damage-Enhanced Boron Diffusion in Epitaxially Grown Si/p-Si$z_{-x}$Ge$x$/n-Si Heterojunction Bipolar Transistors", Journal of Electronic Materials, vol. 24, No. 8, 1995, pp. 999-1002.

Bodnar et al., "Growth of Ternary Alloy Si$z_{-x-y}$Ge$x$C$y$ By Rapid Thermal Chemical Vapor Deposition", Journal Vac. Science Technology, A., vol. 1. 13, No. 5, Sep./Oct. 1995, pp. 2336-2340.

Regolini et al., "Growth and Characterization of Strain Compensated Si$z_{-x-y}$Ge$x$C$y$ Epitaxial Layers", Materials Letters 18, 1993, pp. 57-60.

Lanzerotti et al., "Si/Si$z_{-x-y}$Ge$x$C$y$/Si Heterojunction Bipolar Transistors", IEEE Electronic Device Letters, vol. 17, No. 7, Jul. 1996, pp. 334-337.

Poate et al., "Ion Implantation and Transient Enhanced Diffusion", IEDM 95-77, IEEE 1995, pp. 4.1.1-4.1.4.

* cited by examiner

SILICON GERMANIUM HETEROJUNCTION BIPOLAR TRANSISTOR WITH CARBON INCORPORATION

CROSS-REFERENCE TO RELATED APPLICATIONS

This application is a division of U.S. application Ser. No. 09/683,498 filed Jan. 9, 2002 now U.S Pat. No. 6,670,654.

BACKGROUND OF THE INVENTION

The present invention generally relates to silicon germanium (SiGe) technology, and more particularly to a silicon germanium carbon heterojunction bipolar transistor (SiGeC HBT) for use in various electronic devices.

DESCRIPTION OF THE RELATED ART

Silicon Germanium (SiGe) technology has become mainstream in today's RF (radio frequency) applications, high speed wired data transmission, test equipment, and wireless applications. However, two limitations exist in conventional SiGe HBT devices.

First, the silicon germanium alloy film must remain below a critical thickness. The relationship for the critical thickness follows different physical models, such as the People and Bean, and Stiffler models. These theoretical models demonstrate the relationship of the allowed critical thickness of the silicon germanium film as a function of the germanium concentration. These models indicate that, as the germanium increases (from 0% to 100%), the critical thickness of the film decreases. The critical thickness of a film is the thickness where misfit dislocations are initiated. The transition of a materially stable film to an unstable film is the point where the misfit dislocations are formed.

Because germanium falls below silicon in column four of the Periodic Table, it has a larger lattice constant than silicon. Thus, free-standing silicon germanium will have a larger lattice constant compared to the silicon lattice. One may fit this larger lattice constant silicon germanium material on the smaller silicon substrate by accommodating the difference in the lattice constant through the introduction of misfit dislocations. This silicon germanium film is called the relaxed layer. Additionally, one may grow a layer of silicon germanium on silicon by compressing the horizontal lattice constant of the silicon germanium film to fit on the substrate silicon lattice sites without the introduction of misfit dislocations. This compression of the horizontal silicon germanium lattice constant leads to an increase in the vertical lattice constant. This silicon germanium film is called a "strained" or pseudomorphic silicon germanium film. Increasing the germanium concentration increases the strain in the layer, hence limiting the allowed thickness of the film. Therefore, a solution is required to allow for a means to relieve the strain in order to increase either the germanium concentration or the film thickness.

Thus, there remains a need for a SiGe HBT device which overcomes the limitations of the conventional devices, such as the critical thickness requirement of silicon germanium film, and the outdiffusion of the base dopants which limits base width scaling.

BRIEF SUMMARY OF THE INVENTION

In view of the foregoing and other problems, disadvantages, and drawbacks of the conventional silicon germanium heterojunction bipolar transistor devices, the present invention has been devised, and it is an object of the present invention to provide a structure for a silicon germanium heterojunction bipolar transistor device having substitutional carbon dopants in the silicon germanium alloy film. It is another object of the present invention to provide a device which allows for electrostatic discharge protection. Still another object of the present invention is to provide a device which utilizes a tighter statistical distribution of the electrostatic discharge failure voltage. Yet another object of the present invention is to provide a device which uses carbon to provide a larger margin of thickness to allow for a higher thermal strain prior to dislocation formation. It is still another object of the present invention to provide a heterojunction bipolar transistor device which relieves the strain in a silicon germanium alloy film of the heterojunction bipolar transistor device which increases either the germanium concentration or the film thickness. Another object of the present invention is to provide a heterojunction bipolar transistor device, which provides a tighter distribution of sheet resistance, base widths, and breakdown voltages. Still another object of the present invention is to provide a heterojunction bipolar transistor device which controls the outdiffusion of boron. Yet another object of the present invention is to provide a device which achieves a higher unity current gain cutoff frequency (fT) and unity power gain cutoff frequency ($f_{MAX}$).

In order to attain the objects suggested above, there is provided, according to one aspect of the invention, a SiGe HBT device with carbon incorporation. Specifically, by adding small amounts of substitutional carbon dopant to a $Si_{1-x}Ge_x$ layer, the critical thickness requirement is relaxed for the People and Bean, and Stiffler models, previously described. Because a carbon atom is smaller than a silicon atom, the stress introduced by the germanium atom can be relieved by a smaller atom. Hence, carbon compensates for the strain introduced in the film by germanium. Thus, using a device which introduces a lower initial strain condition allows for a higher thermal strain prior to the initiation of misfit dislocations. Adding carbon to the base region of a silicon germanium epitaxial film allows for a more thermal robustness during an electrostatic discharge event. This is true for bipolar transistors and associated elements that can be constructed, such as varactor structures, pin diodes, and other passive elements formed in this film.

Moreover, carbon provides suppression of the transient enhanced diffusion of boron base dopant outdiffusion in SiGe HBT devices. The importance of this effect allows extensions of SiGe HBT devices to achieve a higher unity current gain cutoff frequency ($f_T$) and unity power gain cutoff frequency ($f_{MAX}$). Electrostatic discharge sensitivities and electrostatic discharge implications of the silicon germanium carbon (SiGeC) heterojunction bipolar transistor, or carbon incorporation into the base of a silicon germanium film, will lead to a tighter base width control, and, hence a tighter breakdown distribution.

During an electrostatic discharge (ESD) event, significant increases occur inside the SiGe HBT device's silicon germanium film. As the temperature of the film increases, an additional thermal strain can be initiated. The increase in thermal strain is an additive to the pre-existing strain in the film. Moreover, thermal strain is proportional to temperature. Hence, it would be an advantage to provide a means to reduce the total strain in the film during an electrostatic discharge event by reducing the initial strain in the pseudomorphic silicon germanium film so that misfit dislocations are not generated during an electrostatic discharge event.

Also, base dopants outdiffuse, which limits the base width scaling. One advantage of a heterojunction bipolar transistor is the ability to have a much higher base doping concentration compared to homojunction transistors. One of the major constraints related to conventional SiGe HBT devices is the boron outdiffusion in the base region. With the high doping concentration, the base doping concentration can exceed the emitter doping concentration by an order of magnitude, and can exceed the collector doping concentration by 2 to 3 orders of magnitude. As a result, when boron outdiffusion occurs, the base dopants compensate the emitter and collector regions leading to larger base widths. As the base width increases, the transit time across the base increases, leading to slower transistors. Hence, there is a limit to how much dopant can be achieved within the base region because the low sheet resistance can be compromised by the larger base widths. Boron diffusion is increased in silicon because of transient enhanced diffusion (TED) effects due to the excess of interstitials created by implantations. Boron transient enhanced diffusion plays a role in the outdiffusion of the Boron dopants during hot processing. Because the population of excess interstitials can vary statistically, this can lead to a wider distribution and poorer control of the outdiffusion. Combining this effect with hot process variations (e.g., temperature control during hot processing), the base resistance and the base width can vary in a SiGe HBT device with a heavily doped boron base region.

The variations in base width leads to statistical variations in the unity current gain ($f_T$) and unity power gain ($f_{MAX}$). The variations in the distribution can lead to worst case radio frequency parameters as well as a lower breakdown voltage. When an electrostatic discharge event occurs, if the distribution of the breakdown voltages translates to a lower second breakdown or thermal runaway, this leads to a degradation in the electrostatic discharge robustness of the transistor element. Hence, it would be valuable to be able to provide a means of providing a tighter distribution of sheet resistance, base widths, and breakdown voltages by controlling the outdiffusion of boron.

Therefore, a novel silicon germanium heterojunction bipolar transistor device is disclosed that comprises a semiconductor region, and a diffusion region in the semiconductor region, wherein the diffusion region is boron-doped. The semiconductor region comprises a dopant therein to minimize boron diffusion. A combination of the amount of the dopant, the amount of the boron, and the size of the semiconductor region is such that the diffusion region has a sheet resistance of less than approximately 4 Kohms/cm$^2$. The dopant comprises carbon. Also, the diffusion region is boron-doped at a concentration of $1\times10^{20}/cm^3$–$1\times10^{21}/cm^3$. Preferably, the semiconductor region comprises 5–25% germanium and 0–3% carbon. The device further comprises a collector structure connected to a base region, wherein the base region comprises the diffusion region.

Alternatively, a device is disclosed that comprises a semiconductor substrate and a plurality of bipolar transistors on the semiconductor substrate. Each of the bipolar transistors comprises a base region having a base resistance. One of the bipolar transistors has a base resistance below approximately 4 Kohms/cm$^2$.

Still alternatively, a transistor structure is disclosed that comprises a substrate, a collector region in the substrate, an epitaxial base region on the collector structure containing a $Si_{1-x-y}Ge_xC_y$ compound, an emitter region on the epitaxial base region, and a boron-doped base implant diffusion region, wherein the base dopant implant diffusion is suppressed by the $C_y$ concentration. In the above chemical formulas, subscripts x and y are indicated as percentages.

Moreover, by adding carbon to the semiconductor region, the device achieves an electrostatic discharge robustness, which further causes a tighter distribution of a power-to-failure of the device, and increases a critical thickness and reduces the thermal strain of the semiconductor region.

BRIEF DESCRIPTION OF THE SEVERAL VIEWS OF THE DRAWINGS

The foregoing and other objects, aspects and advantages will be better understood from the following detailed description of a preferred embodiment of the invention with reference to the drawings, in which.

DETAILED DESCRIPTION OF THE INVENTION

As mentioned, silicon germanium technology has become a mainstream technology in today's radio frequency applications, high speed wired data transmission, test equipment, and wireless applications. However, the prior art silicon germanium heterojunction bipolar transistor devices suffer from two important limitations. First, the silicon germanium alloy film must remain below a critical thickness. Second, base dopants outdiffuse, which limits the base width scaling.

More specifically, germanium is introduced into the silicon layer to control the bandgap of the heterojunction bipolar transistor. Inclusion of germanium into the silicon introduces undesirable strain. At sufficient thicknesses, this strain can result in cracking (dislocations). Occurrences of such dislocations increase during thermal cycling. Therefore, the thickness of the silicon germanium layer is limited in conventional structures. As explained in greater detail below, by introducing carbon into the silicon germanium layer, the strain is reduced, thereby decreasing the occurrence of dislocations and allowing a thicker silicon germanium layer to be utilized.

In addition, as also explained in greater detail below, the carbon influences the boron in the base of the transistor. An important advantage of including carbon within the semiconductor is that the dopant diffusion can be increased dramatically to substantially lower sheet resistance. The carbon limits the diffusion movement of the boron, thereby physically limiting the size of the base. With a more tightly controlled boron process, the ability of the structure to be scaled to smaller sizes is increased. In addition, with less boron outdiffusion, a more consistent transistor is produced. Further, the tighter physical distribution of the boron impurity increases speed and breakdown voltages (which decreases electrostatic discharge (ESD) effects).

The invention solves the conventional problems by adding small amounts of substitutional carbon dopant to a $Si_{1-x}Ge_x$ layer, or a ternary alloy $Si_{1-x-y}Ge_xC_y$, to relax the alloy thickness requirement (e.g., allow the semiconductor alloy layer to be thicker). Moreover, carbon suppresses the transient enhanced diffusion of the boron base dopant in SiGe HBT devices. Reducing outdiffusion allows for the extension of SiGe HBT devices to attain a higher unity current gain cutoff frequency ($f_T$) and unity power gain cutoff frequency ($f_{MAX}$).

Figure 1:
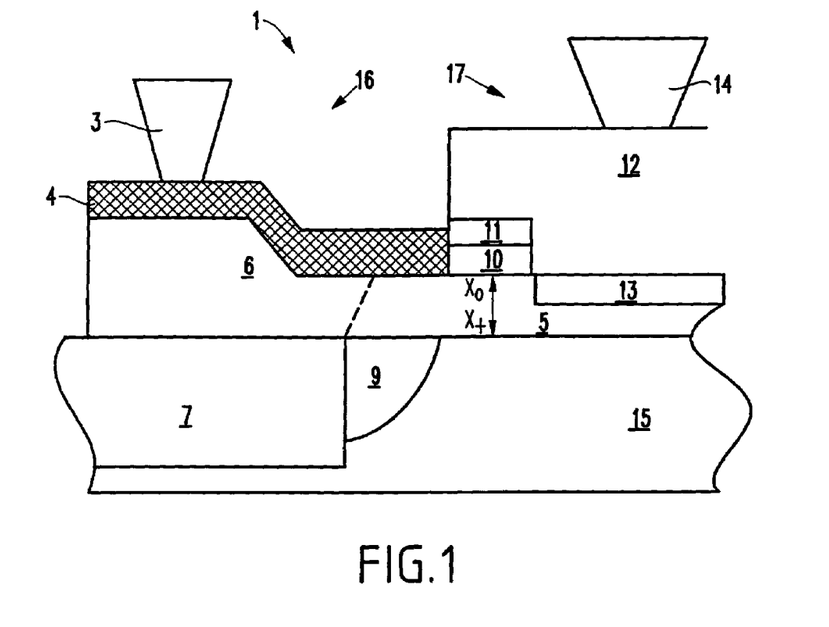
FIG. 1 is a schematic diagram of a silicon germanium heterojunction bipolar transistor device according to the present invention.

Referring now to the drawings, and more particularly to FIGS. 1–15, there are shown preferred embodiments of the method and structures according to the present invention. Specifically, FIG. 1 shows a cross-sectional view of a SiGeC HBT structure 1 according to the present invention. The transistor device 1 has a base region 16, an emitter region 17, and a collector 15.

The base region 16 includes a base contact 3 disposed on a silicide film 4, which is made of any refractory metal such as titanium and cobalt. The silicide film 4 is formed within the upper surface of a conductive amorphous polysilicon germanium carbon film (semiconductor film region) 6, which lies over a shallow trench isolation (STI) region 7. Adjacent the shallow trench isolation region 7 is a P+ dopant implant 9. Between the collector 15 and the emitter 12, 13 lies the base 5 which comprises a single crystal silicon germanium carbon semiconductor.

Figure 12:
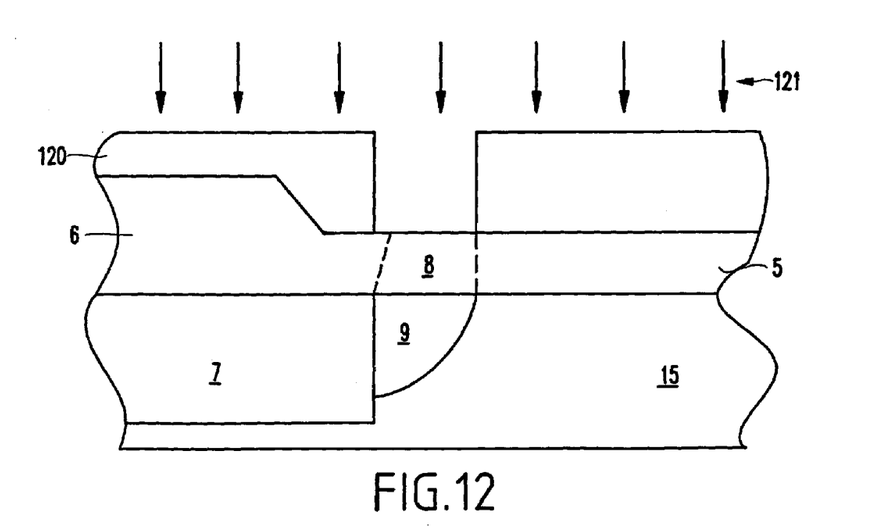
FIG. 12 is a schematic diagram of a partially completed bipolar transistor according to the invention.

The carbon in the semiconductor region 5 minimizes diffusion from the boron doped region 8 (see FIG. 12). Together, the contact 3, silicide film 4, SiGeC film 6, and boron doped region 8 form the extrinsic base structure 16. Preferably, the use of the carbon dopant allows dramatic increases in the amount of boron such that the base 5 has a sheet resistance of less than approximately 4 Kohms/cm².

More specifically, the invention uses a doping concentration (e.g., boron) of approximately $1\times10^{10} cm^3$, while conventional structures/processes are limited to approximately $1\times10^6 cm^3$. This produces peak concentrations of $1\times10^{21} cm^3$ of the dopant. This allows the base 5 to have a substantially reduced sheet resistance (4 Kohm/cm²) when compared to the sheet resistance (10 Kohm/cm²) of conventional base structures. These higher concentrations of dopant do not detrimentally affect the inventive structure because the carbon included within the base layer 5 prevents substantial dopant outdiffusion.

The emitter region 17 is formed over the semiconductor 5. Insulator layers 10, 11 isolate the base region 16 from the emitter region 17, which prevents the emitter region 17 from shorting to the base region 16. Insulator layer 10 is preferably silicon dioxide, while insulator 11 is preferably silicon nitride. The emitter region 17 preferably includes a conductive polysilicon film 12, which is N+ doped. After the emitter region 12 is heat cycled, an N+ doped diffusion 13 is created in the SiGeC film 5. Additionally, an emitter contact 14 is disposed on the polysilicon film 12.

The device 1 operates by forming an electrical connection (increasing conductivity of the semiconductor 5) between the collector 15 and the contact 14 of the emitter 17 (through polysilicon 12 and diffusion 13) when a base current is injected into the base 5 (through contact 3, silicide 4, and polysilicon 6). The device 1 operates as does a conventional heterojunction bipolar transistor device; however, the invention yields a device having a much greater performance.

More specifically, an increase in performance is seen by including carbon in the single crystal silicon germanium layer 5, which allows the size of the boron diffusion within the semiconductor layer 5 to be much more strictly controlled. The carbon bonds with the boron, thereby limiting its diffusion movement and maintaining a much tighter distribution of the boron atoms within a smaller area of the semiconductor layer 5. This increases operating speed, breakdown voltages, permits greater scaling (size reduction), and allows increased dopant concentrations, which reduces sheet resistance.

In addition, carbon is a smaller atom than germanium and bonds with the silicon to reduce the strain within the entire silicon germanium layer 5, 6. Therefore, the invention avoids misfit dislocations (cracks), which are caused by excessive strain. Because of the strain reduction produced by carbon, the probability of strain related cracking (dislocations) is substantially reduced in the silicon germanium layer 5, 6.

Heterojunction bandgap engineering of a SiGeC device requires proper doping and concentration of the boron 21, carbon 22, and germanium 23 populations. The schematic of FIG. 2 indicates the relative doping concentrations of the boron 21, carbon 22, and germanium 23 along the thickness of the epitaxial layer 5, 6. More specifically, the $N_x$ axis represents relative chemical concentrations. The X axis represents the thickness of the epitaxial boron doped epitaxial layer 5, 6 as it passes from the silicide layer 4 ($X_0$) to the wafer 15 ($X_t$). Therefore, the concentrations of impurities vary from the top to the bottom of the epitaxial layer 5, 6. While the germanium 23 is spread somewhat evenly from top to bottom and is shown as increasing/decreasing gradually near the top and bottom, the shape of this concentration curve can take on the form of a triangle, rectangle, trapezoid, etc. The carbon 22 region should be below the level of the emitter diffusion 13. Boron 21 is in the central region. As discussed above, the carbon 22 helps to keep the boron 21 in a tight physical distribution within the epitaxial layer 5, 6.

The present invention provides for electrostatic discharge protection, and produces a tighter statistical distribution of the electrostatic discharge failure voltage. Electrostatic discharge sensitivities and electrostatic discharge implications of the silicon germanium carbon heterojunction bipolar transistor (SiGeC HBT) are discussed below. Transmission line pulse (TLP), human body model (HBM) and machine model (MM) test results for the present SiGeC HBT devices demonstrate that the inventive silicon germanium with carbon incorporation has an improved electrostatic discharge statistical control (tighter sigma) compared to the conventional silicon germanium devices. Furthermore, the inventive SiGeC HBT device has a comparable mean electrostatic robustness as a SiGe HBT device. Moreover, the mean electrostatic discharge voltage-to-failure between the SiGe and SiGeC device are not significantly different. These results are important because the inventive device with carbon incorporation has as good a performance, or even better, than the standard devices without carbon incorporation. Furthermore, the inventive SiGeC HBT device achieves better results than conventional SiGe HBT devices as shown by the tightness of the statistical distribution resulting from the tests, as shown below. That is, by introducing carbon into these devices, the device performance does not degrade, which is contrary to what would normally be expected.

The distribution of the power-to-failure, current-to-failure, and voltage-to-failure for a SiGeC device is significantly tighter than that of conventional SiGe devices. This is important for manufacturing high-speed devices where the radio frequency circuitry will be in a common-emitter mode for a number of circuit applications and electrostatic discharge devices may not be present. Moreover, because there is a distribution of the "power" input and a distribution of "power-to-failure" of the device, the total device failure is the overlap between these distributions.

The ability of carbon to provide improved base resistance control translates to less variation in the current-to-failure, voltage-to-failure, and power-to-failure levels. These results are consistent with theoretical electrostatic discharge models on the statistical variations of bipolar transistors and translates to electrostatic discharge statistical variation and control. Additionally, the incorporation of carbon is important for electrostatic discharge because it provides low base resistance. This allows higher boron concentrations to be used while still maintaining good device and radio frequency characteristics. Also, DC and radio frequency characteristics are analyzed pre- and post-ESD stress (below), showing the relationship between the percentage DC shift, forward voltage, peak $f_T$, current gain $\beta$, and ESD magnitude.

The present invention improves electrostatic discharge control by the incorporation of carbon atoms in the silicon germanium heterojunction bipolar transistor device 1. Furthermore, the present invention improves the power-to-failure characteristics of a semiconductor device by incorporating carbon in the silicon germanium alloy 5, 6. Moreover, the present invention improves the margin to the critical thickness and stability of a silicon germanium alloy film 5 during thermal transients (and processing) by incorporating carbon atoms in the silicon germanium alloy film 5.

Figure 3:
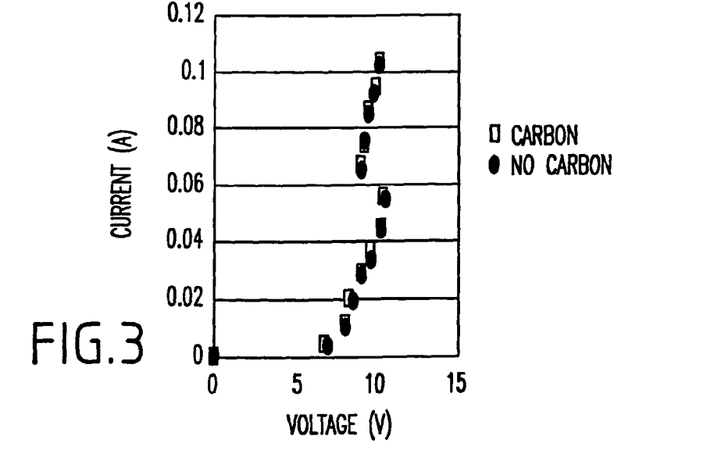
FIG. 3 is a graphical representation of the transmission line pulse Current-Voltage characteristics.

Process splits are performed with and without carbon in the SiGe HBT device in FIG. 3. FIG. 3 shows some typical common-emitter transmission line pulse Voltage (V) vs. Current (I) measurements comparing a 0.44×3.2 µm SiGe and SiGeC HBT npn (wherein npn is a bipolar transistor, whereby n refers to the emitter, p refers to the base, and n refers to the collector). As shown, both the inventive and conventional structures perform in a similar manner. This is significant, as it shows that there is no degradation of electrostatic discharge performance in a silicon germanium device when carbon is incorporated therein.

Figure 4:
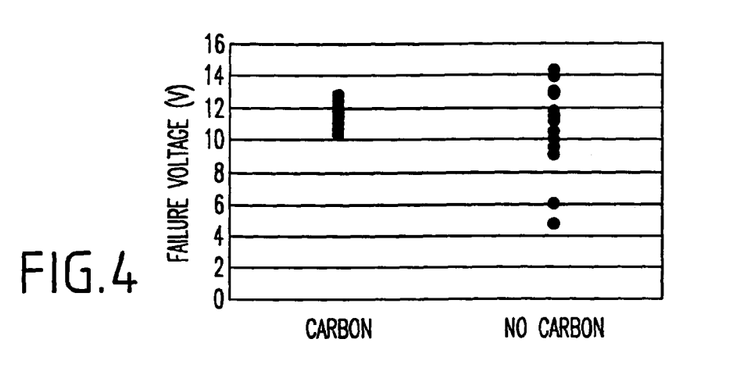
FIG. 4 is a graphical representation showing a comparison of a carbon doped versus a non-carbon doped transistor device.
Figure 5:
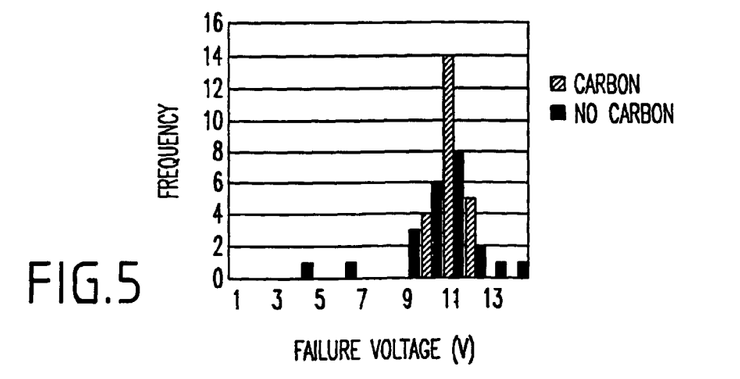
FIG. 5 is a graphical representation showing a comparison of a carbon doped versus a non-carbon doped transistor device.

FIGS. 4 and 5 show the comparison of the voltage-to-failure of the present SiGeC and a conventional SiGe HBT device. As shown in FIG. 4, the data of the voltage-to-failure with carbon incorporation has a tighter distribution when compared to conventional non-carbon structures. That is, the failure voltage ranges from approximately 10 to 12 volts with the inventive structure. Conversely, the data of the voltage-to-failure without carbon incorporation has a larger distribution, ranging from approximately 5 to 15 volts. Thus, conventionally, the data is more uncontrollable and, hence, there is a higher probability of device failure with conventional devices.

FIG. 5 shows a Gaussian distribution of pulse events, which emanate from electrostatic discharge events. A higher standard deviation is evident of a higher probability of device failure with the non-carbon SiGe HBT devices. When the distribution of pulse events exceeds the power-to-failure level, then the device will fail. In this context, a statistical distribution having a larger range is usually indicative of a device which will fail. As FIG. 5 indicates, the non-carbon SiGe HBT device is a weaker structure that is more apt to fail when compared to the inventive SiGeC HBT device.

Figures 6, 7, 8:
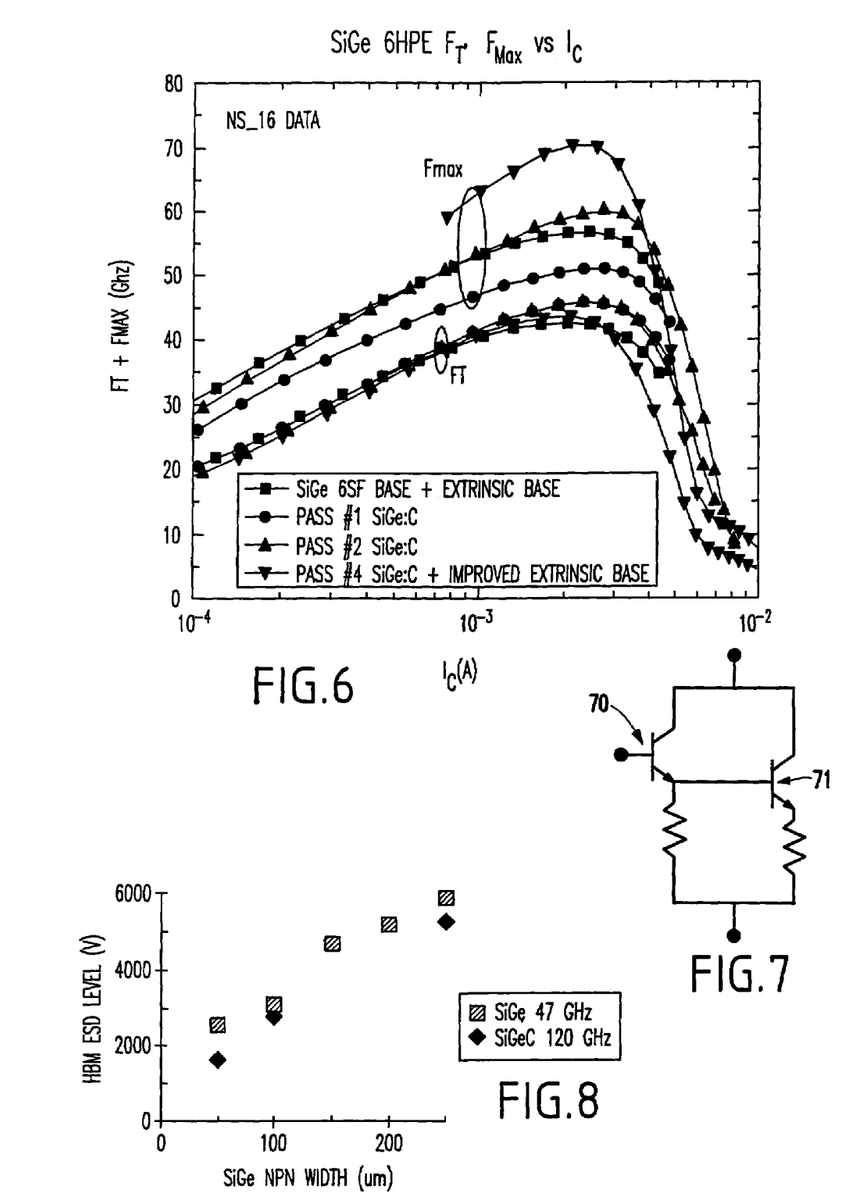
FIG. 6 is a graphical representation showing a comparison of a carbon doped versus a non-carbon doped transistor device.
FIG. 7 is a schematic diagram of an electrostatic discharge power clamp circuit.
FIG. 8 is a schematic diagram showing a comparison of two SiGeC electrostatic discharge power clamp devices.

FIG. 6 shows the typical radio frequency characteristics of devices with and without carbon. The SiGeC electrostatic discharge results clearly show a significantly tighter electrostatic discharge distribution in all splits performed when compared to SiGe electrostatic discharge. Parametric data shows that the base resistance control is superior when carbon is incorporated into the base of the SiGe npn HBT device because of improved control over the boron transient enhanced diffusion. This is evident from the DC electrical distribution of the base pinch resistance monitors. Hence, the SiGeC HBT provides improved electrostatic discharge control due to improved base resistance distribution. Thus, higher manufacturability is established with tighter electrostatic discharge control and lower yield loss with the invention. This is a significant issue as a means to provide better electrostatic discharge control in the field. The tighter distribution provides a better ability to prevent field failures as well as providing an improved prediction of the reliability of the devices.

Additionally, carbon, as a substitutional atom, relieves stress in the silicon germanium film. As a result, the critical thickness of the film increases with carbon incorporation. Given this important and significant result, when a higher thermal pulse is initiated, the amount of thermal strain energy from a pulse of temperature T that a device can withstand increases if the critical thickness curve is elevated for a given germanium concentration. As a result, carbon serves as a means to provide a more stable device with respect to thermal pulses.

An advantage of silicon germanium heterojunctions compared to silicon homojunction transistors is the ability to provide a high $f_T$ with a high base doping concentration. Typically, in these heterojunction transistors, the Rdb (base resistance) is 10 Kohm/cm$^2$. This provides a high $f_T$ but a lower $f_{MAX}$ since the base resistance and base-collector capacitance lowers the $f_{MAX}$.

One problem with increasing the base doping concentration is that the diffusion of the base dopants into the emitter and collector region lowers the performance due to boron diffusion into the emitter and collector regions (high capacitance, non-ideal base currents, etc).

For power amplifier (PA) applications, a high $f_{MAX}$ is more desirable. High $f_{MAX}$ is achieved by lowering the base resistance to 1–4 Kohm/cm$^2$ instead of 10. For a multi-finger npn, a lower base resistance allows even better voltage distribution through the whole structure and improved linearity, ACPR (Across Channel Power Rejection), and peak power-to-failure. For electrostatic discharge elements, likewise, a high base resistance provides better current distribution through the base region and a higher unity gain power cutoff. As a npn, this is useful for electrostatic discharge power clamp applications. For a base-collector varactor, a 1–4 Kohm/cm² base is advantageous. Moreover, a lower base resistance decreases the series resistance of the diode structure and provides a better current distribution.

The present invention uses carbon in the epitaxial base region to prevent boron outdiffusion in silicon germanium npn transistors and silicon germanium varactor structures for power transistors and electrostatic discharge protection structures. Suppression of boron outdiffusion in a SiGe HBT device using carbon reduces the diffusion of boron under postgrowth implantation and annealing processes. A standard measure of outdiffusion is the Shuppen Factor (SF), which measures the collector saturation current before and after annealing. As the outdiffusion occurs, the Shuppen Factor decreases. Carbon acts as a trap for interstitials thereby, suppressing both the transient enhanced diffusion boron diffusion and the interstitial driven clustering of boron.

In accordance with the present invention, it has been shown that adding carbon to the base is an effective method for improving the Shuppen Factor. Also, in accordance with the present invention, a new SiGe, SiGeC, Si npn, and varactor is disclosed to achieve the objectives of a high $f_{MAX}$, an acceptable $f_T$, low base resistance (1 Kohm/cm²), and the ability to use the technology in electrostatic discharge networks and power amplifiers.

Figure 2:
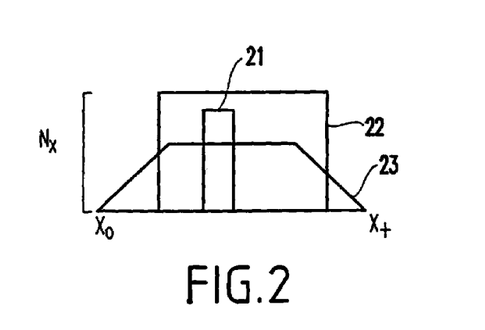
FIG. 2 is a schematic diagram of the relative doping concentrations of the boron, germanium, and carbon dopants in the silicon germanium heterojunction bipolar transistor device according to the present invention.

This is achieved by increased base doping concentrations well above present base doping concentrations and incorporation of carbon in the silicon germanium UHV/CVD (Ultra High Vacuum Chemical Vapor Deposition) process step as the silicon germanium is formed. The composites could be Si (0.795) Ge (0.2) C (0.005), where there is 79.5% silicon, 20% germanium, and 0.5% carbon to form the SiGeC compound. Preferably, there is a 5–25% germanium and 0–3% carbon in the semiconductor region 5. This includes peak concentrations of $1\times10^{21}$/cm³ germanium, $1\times10^{20}$/cm³ carbon, and $1\times10^{20}$/cm³ to $1\times10^{21}$/cm³ boron. Thus, as seen in FIG. 2, the base 5 is boron-doped at the above concentrations.

Table 1 below shows the radio frequency characterization results from electrostatic discharge testing. The result of the electrostatic discharge testing includes an analysis of the S-parameter, $f_T$ vs. $I_C$ (collector current), and β (current gain) degradation as a function of electrostatic discharge pulses in forward and reverse polarity.

The radio frequency test results show that for positive or negative electrostatic discharge pulses, the $f_T$ vs. $I_C$ characteristic degrades peak $f_T$ as well as the $f_T$ vs. $I_C$ at lower frequencies. This indicates that, just before an electrostatic discharge pulse is applied to a SiGeC HBT device, the net starting point of the $f_T$ and $f_{MAX}$ will be at a better performance level than a conventional SiGe HBT device. In fact, even after an electrostatic discharge pulse is applied to the SiGeC HBT device, the relative starting point of the $f_T$ and $f_{MAX}$ will be at a better performance level when compared with a conventional SiGe HBT device (without carbon incorporation). Transmission line pulse, human body model, and machine model verification of the SiGeC device in practical implementations for electrostatic discharge protection is also completed by the development of SiGeC power clamps in the next technology generation.

TABLE 1

| HBM Voltage (V) | Forward Voltage (V) | Peak Cutoff Frequency $f_T$ (GHz) | Current Gain β |
| --- | --- | --- | --- |
| −50 | 0.72 | 46.49 | 41.38 |
| −75 | 0.42 | 42.59 | 19.6 |
| −100 | 0.38 | 34.78 | 9.7 |
| −150 | 0.05 | 32.47 | 8.4 |

Table 1 shows an example of radio frequency parametric degradation as a function of HBM electrostatic discharge pulse voltage in reverse stress emitter base degradation mode for a 0.44×3.2 µm SiGeC HBT device. Radio frequency testing is completed before and after introduction of the electrostatic discharge pulse stress.

In FIG. 7, an electrostatic discharge power clamp circuit is shown using a high performance 120 GHz/100 GHz ($f_T/f_{MAX}$) SiGeC trigger element 70 and a SiGeC clamp element 71. With the improved base width control, better statistical control of the trigger voltage of this circuit is achieved.

FIG. 8 shows a comparison of a 0.18 µm technology SiGeC and 0.5 µm technology SiGe electrostatic discharge power clamp. The power clamp triggers at the $BV_{CEO}$ (Break Down Voltage from Collector to Emitter (Open Base)) of the 120 GHz/100 GHz transistor, providing a low trigger voltage (e.g., approximately 2 V). The SiGeC electrostatic discharge power clamps are more suitable for high performance technologies by providing trigger voltages significantly lower than conventional diode-triggered electrostatic discharge power clamps. In accordance with the present invention, electrostatic discharge robust power clamps, up to 6,000 V HBM levels with a low voltage trigger, can be constructed for BiCMOS devices with a 120 GHz SiGeC in 0.11 µm $L_{eff}$ CMOS/BiCMOS technology. With the improved base width control, better statistical control of the trigger voltage of this circuit is achieved. Thus, electrostatic discharge robustness in a device occurs by adding carbon to the semiconductor film and doping the diffusion region within the semiconductor film with a boron base implant.

Figure 9A:
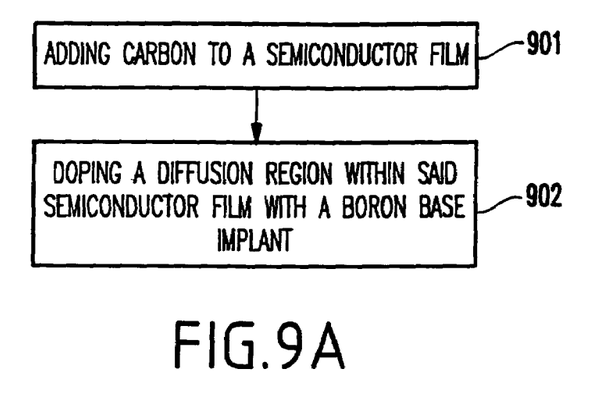
FIG. 9 is a flow diagram illustrating a preferred method of the present invention.
Figure 9B:
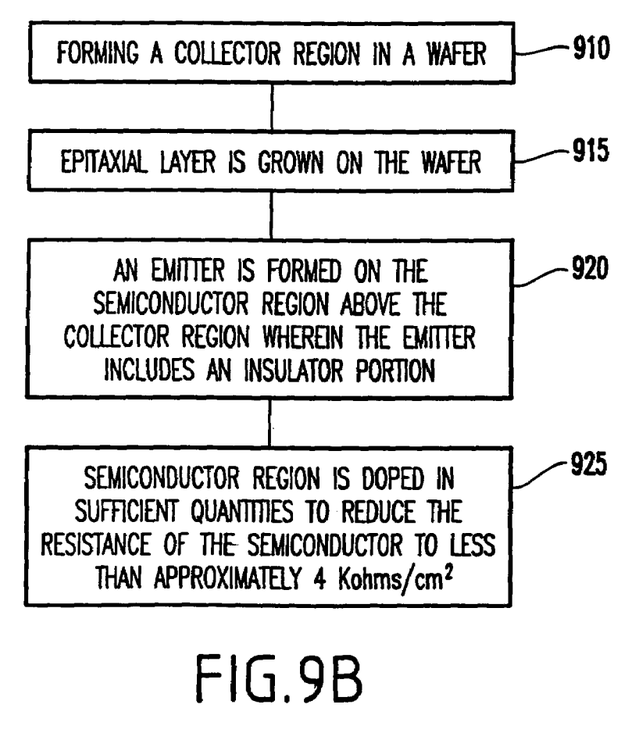

FIG. 9(B) illustrates a preferred method of forming a bipolar transistor, according to the present invention. The method comprises forming 910 a collector region 15 in a wafer. Next, an epitaxial layer 5, 6 is grown 915 on the wafer. The epitaxial layer comprises carbon, and has a semiconductor region 5 above the collector region 15. Then, an emitter 17 is formed 920 on the semiconductor region 5, wherein the emitter 17 includes an insulator portion 10, 11. Finally, the semiconductor region 5 is doped 925 in sufficient quantities to reduce the resistance of the semiconductor 5 to less than approximately 4 Kohms/cm². The step of doping 925 provides the dopant in peak concentration of approximately $1\times10^{20}$ per cm³ to $1\times10^{21}$ per cm³. As mentioned, the carbon limits the outdiffusion of the dopant within the semiconductor region 5. Moreover, the dopant comprises one of boron, aluminum, gallium, indium, and titanium. Also, as mentioned, the semiconductor region 5, 6 comprises silicon germanium. Additionally, the carbon maintains the dopant within a central portion of the semiconductor region 5, 6, which is best seen in FIG. 12. Finally, the step 915 of growing the epitaxial layer includes growing a material including a concentration of carbon which is less than approximately 3%.

FIG. 9(B) illustrates a preferred method of forming a bipolar transistor, according to the present invention. The method comprises forming 910 a collector region 15 in a wafer. Next, an epitaxial layer 5, 6 is grown 915 on the wafer. The epitaxial layer comprises carbon, and has a semiconductor region 5 above the collector region 15. Then, an emitter 17 is formed 920 on the semiconductor region 5, wherein the emitter 17 includes an insulator portion 10, 11. Finally, the semiconductor region 5 is doped 925 in sufficient quantities to reduce the resistance of the semiconductor 5 to less than approximately 4 Kohms/cm$^2$. The step of doping 925 provides the dopant in peak concentration of approximately $1\times10^{20}$ cm$^3$ to $1\times10^{21}$ cm$^3$. As mentioned, the carbon limits the outdiffusion of the dopant within the semiconductor region 5. Moreover, the dopant comprises one of boron, aluminum, gallium, indium, and titanium. Also, as mentioned, the semiconductor region 5, 6 comprises silicon germanium. Additionally, the carbon maintains the dopant within a central portion of the semiconductor region 5, 6, which is best seen in FIG. 12. Finally, the step 915 of growing the epitaxial layer includes growing a material including a concentration of carbon which is less than approximately 3%.

FIGS. 10–15 illustrate one set of processes that can be utilized to manufacture the inventive bipolar transistor. However, the invention is not limited to the following set of processes. Instead, one ordinarily skilled in the art would understand that a number of other materials, conditions, processing steps, etc., could be utilized to achieve the same results. Thus, the invention is broadly applicable to all similar processes. Processes which are well-known to those ordinarily skilled in the art are not discussed in detail, so as to not obscure the salient features of the invention.

Figure 10:
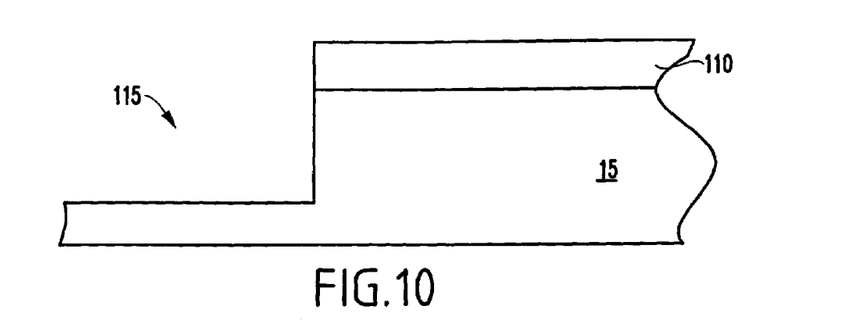
FIG. 10 is a schematic diagram of a partially completed bipolar transistor according to the invention.
Figure 11:
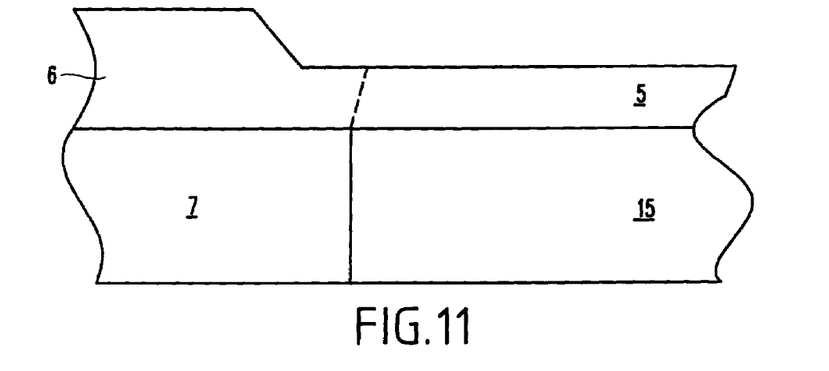
FIG. 11 is a schematic diagram of a partially completed bipolar transistor according to the invention.

More specifically, FIG. 10 illustrates a properly prepared and doped collector region 15 of a wafer. A mask 110 is formed over the collector region and patterned using well-known, conventional patterning techniques. A shallow trench isolation region opening 115 is formed by etching the collector material 15 in areas not protected by the mask 110. The mask 110 is removed, and an isolation material 7 is deposited in the opening 115, as shown in FIG. 11. The structure is then planarized using a well-known process, such as chemical-mechanical polishing (CMP).

An epitaxial growth process is then used to grow a silicon germanium carbon layer (in concentrations such as those discussed above) above the collector region 15. The area above the shallow trench isolation region forms as a polysilicon germanium carbon layer 6, while the area above collector region 15 forms a single crystal silicon germanium carbon layer 5 during such an epitaxial growth process. While silicon germanium carbon is shown in this example, the semiconductor could also comprise any conventional semiconductor doped with carbon.

Figure 13:
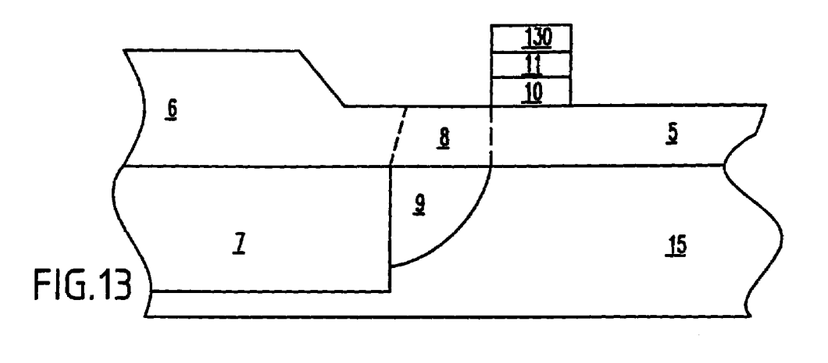
FIG. 13 is a schematic diagram of a partially completed bipolar transistor according to the invention.

Another mask 120 is patterned over the structure and an implant process 121 is performed. The impurity 121 is preferably boron (in concentrations such as those discussed above) and forms impurity regions 8 and 9. The impurity could also be any other type of P-type impurity, such as boron, aluminum, gallium, indium and/or titanium. In FIG. 13, a series of insulators 10, 11 are formed and patterned using, for example, a mask 130. The formation of such layers and the patterning using the mask is well-known to those ordinarily skilled in the art.

Figure 14:
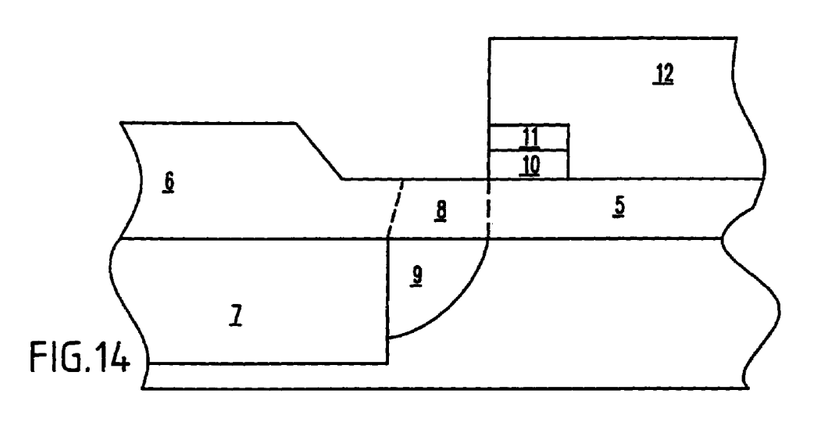
FIG. 14 is a schematic diagram of a partially completed bipolar transistor according to the invention.
Figure 15:
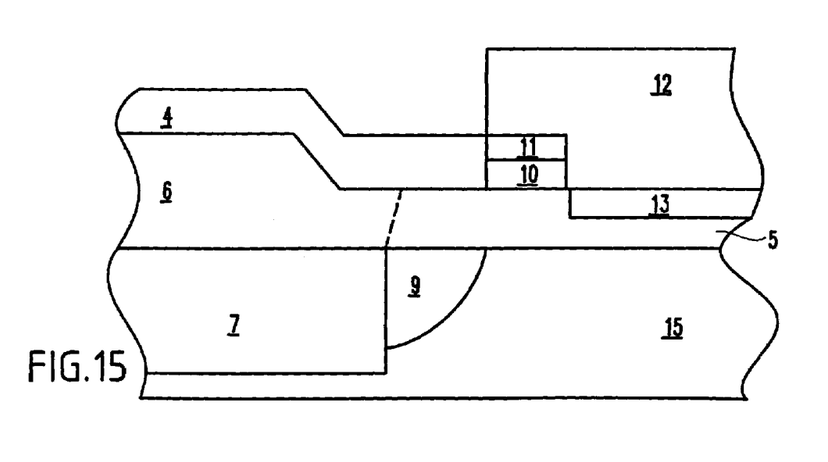
FIG. 15 is a schematic diagram of a partially completed bipolar transistor according to the invention.

Using similar processing, a layer of polysilicon 12 is deposited and patterned, as shown FIG. 14. The structure is then subjected to an annealing process. The polysilicon 12 is preferably doped with an impurity which diffuses to create diffusion region 13 within the single crystal silicon germanium carbon layer 5 during the annealing process, as shown in FIG. 15. Alternatively, the diffusion region 13 could be formed in a separate, patterned, self-aligned implantation process before the polysilicon 12 is formed. In addition, during the annealing process, the dopant 8 (e.g., boron) will diffuse laterally (not horizontally) throughout the entire lateral dimension of the epitaxial layer 5, 6, as is also shown in FIG. 15.

In addition, silicide 4 is formed above the polysilicon 6 using conventional well-known silicide processing to decrease resistance of the polysilicon 6. To complete the structure, conductive contacts 3, 14 (shown in FIG. 1) are formed using well-known deposition and patterning processes. Processes necessary to complete, insulate, and connect the transistor to other devices within the circuit are well-known to those ordinarily skilled in the art and are not discussed herein.

The carbon influences the boron in the base of the transistor. An important advantage of including carbon within the semiconductor is that the dopant diffusion can be increased dramatically to substantially lower sheet resistance. The carbon limits the diffusion movement of the boron, thereby physically limiting the size of the base. With a more tightly controlled boron process, the ability of the structure to be scaled to smaller sizes is increased. In addition, with less boron outdiffusion, a more consistent transistor is produced. Further, the tighter physical distribution of the boron impurity increases speed and breakdown voltages (which decreases electrostatic discharge (ESD) effects).

There are several benefits of the present invention. For example, the present invention provides a silicon germanium heterojunction bipolar transistor device having substitutional carbon dopants in the alloy film, which allows for electrostatic discharge protection. Also, the present invention utilizes a tighter statistical distribution of the electrostatic discharge failure voltage. Moreover, the present invention uses carbon to provide a larger margin to thickness to allow for a higher thermal strain prior to dislocation formation. Furthermore, the present invention relieves the strain in the silicon germanium alloy film of a heterojunction bipolar transistor device, which increases either the germanium concentration or the film thickness. Another benefit of the present invention is that it provides a tighter distribution of sheet resistance, base widths, and breakdown voltages, and further controls the outdiffusion of boron. The present invention also achieves a higher unity current gain cutoff frequency ($f_T$) and unity power gain cutoff frequency ($f_{MAX}$).

A diode structure utilizing the base of the npn as the anode and the collector as the cathode, can be constructed suitable for functional circuits (e.g. current mirrors, diode-transistor logic), bipolar SRAM, analog circuits, ESD networks, varactors and power devices.

Carbon controls the outdiffusion of the boron providing an improved breakdown voltage and better control of the base-collector junction providing a better diode junction. The diode structure containing a SiGeC base anode and a Si collector region will provide a ESD robust element due to the reduced mechanical stress with the introduction of Carbon. As an ESD element, the incorporation of the Carbon in the SiGe anode provides improvements. First, the improved control of the Boron outdiffusion providing a more controlled breakdown voltage. Second, the lower mechanical stress introduced by Carbon, allows for a higher thermal stress prior to misfit dislocation production and mechanical failure. An improved Shuppen Factor will be evident in the device, allowing better process control of the diode element. Third, Carbon will minimize the outdiffusion of the Boron during an ESD impulse and thermal stress preventing the shorting of the diode structure, hot spot formation, mesoplasma formation, thermal instability, and second breakdown (thermal breakdown). Fourth, the addition of Carbon allows for producing a device with a lower sheet resistance in the anode allowing improved current distribution in the device. Hence in the forward bias mode, a lower voltage is produced in the anode, reducing the self heating in the SiGeC film. In the reverse voltage condition, improved voltage control and tighter breakdown voltage will provide a more reliable and rugged ESD structure. A diode structure can also be formed using the SiGeC base region and polysilicon Si emitter region. A diode structure can also be formed by shorting or floating of the emitter or collector of the discussed npn structure. Diodes can be used as ESD circuit elements, double diode networks, diode strings, trigger networks, and ESD control circuitry. Diodes can be used as clamp saturation devices in bipolar SRAM cells. A wide variety of applications exist where this will provide advantages for circuit applications.

Using the above element as a varactor, a better control of the tunability of the varactor can occur with the Carbon incorporation into the SiGe film in the diode structure. Varactors are used in the reverse voltage condition. In the reverse voltage condition, improved voltage control and tighter breakdown voltage will provide a more reliable and improved ruggedness for the varactor structure. This improved control will benefit the predictability of the tunability of the varactor structure.

A Schottky diode structure also can be formed utilizing the advantages of the SiGe film with Carbon incorporation. SiGeC film can be used as the guard ring of the Schottky diode structure. The cathode of the Schottky utilizes the npn collector structure. The Schottky guard ring comprises of the SiGeC film and the Boron dopants. An improved Schottky ruggedness is provided by the utilization of the Carbon in the SiGe film in order to control the outdiffusion as discussed above. An improved Shuppen Factor will be evident in the device, allowing better process control of the Schottky diode element. Third, Carbon will minimize the outdiffusion of the Boron during an ESD impulse and thermal stress preventing the shorting of the diode structure, hot spot formation, mesoplasma formation, thermal instability, and second breakdown (thermal breakdown). Fourth, the addition of Carbon allows for producing a device with a lower sheet resistance in the guard ring allowing improved current distribution in the device. Hence in the forward bias mode, a lower voltage is produced in the anode, reducing the self heating in the SiGeC film. In the reverse voltage condition, improved voltage control and tighter breakdown voltage will provide a more reliable and rugged ESD structure.

Additional structures such as p-i-n diodes, gated diodes, polysilicon bound diodes and other elements known in the art can utilize the above method, and process.

While the invention has been described in terms of preferred embodiments, those skilled in the art will recognize that the invention can be practiced with modification within the spirit and scope of the appended claims.

What is claimed is:

1. A semiconductor layer for use in a bipolar transistor, said semiconductor layer comprising:
   carbon atoms; and
   a first ion-implanted doped region that comprises less than all of said semiconductor layer and comprises a dopant interacting with said carbon atoms, wherein said first ion-implanted doped region extends through said semiconductor layer is aligned above a second ion-implanted doped region in a second semiconductor layer,
   wherein said carbon atoms limit outdiffusion of said dopant to physically limit a size of said doped region within said semiconductor layer,
   wherein said dopant is included at a predetermined peak concentration, and
   wherein a combination of said size of said first ion-implanted doped region and said concentration of said dopant is sufficient to reduce a resistance of said semiconductor layer to less than approximately 4 Kohms/cm$^2$.

2. The semiconductor layer in claim 1, wherein said dopant is included in a peak concentration of approximately $1\times10^{20}$ per cm$^3$ to $1\times10^{21}$ per cm$^3$.

3. The semiconductor layer in claim 1, wherein said dopant comprises one of boron, aluminum, gallium, indium, and titanium.

4. The semiconductor layer in claim 1, further comprising silicon germanium.

5. The semiconductor layer in claim 1, wherein said semiconductor layer is a boron-doped epitaxial semiconductor layer in which boron is introduced only into a central portion of said semiconductor layer during epitaxial deposition process and wherein said carbon atoms further maintain said boron within said central portion of said semiconductor layer.

6. A semiconductor layer for use in a bipolar transistor, said semiconductor layer comprising:
   a single crystalline region;
   a polycrystalline region adjacent said single crystalline region;
   carbon atoms within said single crystalline region and said polycrystalline region; and
   a first ion-implanted doped region in said single crystalline region adjacent to said polycrystalline region,
   wherein said first ion-implanted doped region extends vertically through said semiconductor layer and is aligned above a second ion-implanted doped region in a second semiconductor layer,
   wherein said first ion-implanted doped region comprises a dopant interacting with said carbon atoms,
   wherein said carbon atoms limit outdiffusion of said dopant such that a size of said doped region is physically limited within said semiconductor layer, and
   wherein said dopant is included at a predetermined peak concentration, and
   wherein a combination of said size of said first ion-implanted doped region and said concentration of said dopant is sufficient to reduce a resistance of said semiconductor layer to less than approximately 4 Kohms/cm$^2$.

7. The semiconductor layer in claim 6, wherein said dopant is included in a peak concentration of approximately $1\times10^{20}$ per cm$^3$ to $1\times10^{21}$ per cm$^3$.

8. The semiconductor layer in claim 6, wherein said polycrystalline region is positioned adjacent a shallow trench isolation structure in said second semiconductor layer.

9. The semiconductor layer in claim 6, wherein said semiconductor layer is a boron-doped epitaxial semiconductor layer in which boron is introduced only into a central portion of said semiconductor layer during an epitaxial deposition process and wherein said carbon atoms further maintain said boron within said central portion of said semiconductor layer.

10. The semiconductor layer in claim 6, wherein said carbon atoms reduce strain within said semiconductor layer.

11. A semiconductor layer for use in a bipolar transistor, said semiconductor comprising:
- a single crystalline region;
- a polycrystalline region adjacent said single crystalline region;
- a first ion-implanted doped region in said single crystalline region adjacent said polycrystalline region, wherein said first ion-implanted doped region extends vertically through said semiconductor layer and is aligned above a second ion-implanted doped region in a second semiconductor layer; and,
- carbon atoms within said single crystalline region and said polycrystalline region;
- wherein said carbon atoms limit outdiffusion of said dopant such that a size of said first ion-implanted doped region within said semiconductor layer is physically limited in order to limit a voltage-to-failure distribution to no greater than approximately 12 volts and no less than approximately 10 volts.

12. The semiconductor layer of claim 11, wherein said dopant is included in a peak concentration of approximately $1 \times 10^{20}$ per $cm^3$ to $1 \times 10^{21}$ per $cm^3$.

13. The semiconductor in claim 11, wherein said polycrystalline region is positioned adjacent a shallow trench isolation structure in a second semiconductor layer.

14. The semiconductor layer of claim 11, wherein said semiconductor layer is a boron-doped epitaxial semiconductor layer in which boron is introduced only into a central portion of said semiconductor layer during an epitaxial deposition process and wherein said carbon atoms further maintain said boron within said central portion of said semiconductor layer.

15. The semiconductor layer in claim 11, wherein said carbon atoms reduce strain within said semiconductor layer.

* * * * *